(12) United States Patent
Kim et al.

(10) Patent No.: US 8,518,497 B2
(45) Date of Patent: Aug. 27, 2013

(54) METHODS FOR THE PREPARATION OF COIL-COMB BLOCK COPOLYMERS AND THEIR NANOSTRUCTURES

(75) Inventors: Sang Youl Kim, Daejeon (KR); Myungeun Seo, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 538 days.

(21) Appl. No.: 12/662,313

(22) Filed: Apr. 9, 2010

(65) Prior Publication Data

US 2010/0285276 A1    Nov. 11, 2010

(30) Foreign Application Priority Data

May 7, 2009    (KR) .................. 10-2009-0039545

(51) Int. Cl.
*B05D 3/02*    (2006.01)
*B05D 3/06*    (2006.01)

(52) U.S. Cl.
USPC ........... 427/493; 427/508; 427/510; 427/512; 427/532; 427/533; 427/534; 427/535; 427/536; 427/539

(58) Field of Classification Search
None
See application file for complete search history.

(56) References Cited

U.S. PATENT DOCUMENTS

| | | | |
|---|---|---|---|
| 6,565,763 B1 * | 5/2003 | Asakawa et al. ................. 216/56 |
| 2002/0158342 A1 * | 10/2002 | Tuominen et al. ............. 257/784 |
| 2009/0233236 A1 * | 9/2009 | Black et al. .................... 430/311 |
| 2009/0236309 A1 * | 9/2009 | Millward et al. ................. 216/39 |
| 2009/0240001 A1 * | 9/2009 | Regner ............................ 525/95 |
| 2009/0263628 A1 * | 10/2009 | Millward ....................... 428/173 |

FOREIGN PATENT DOCUMENTS

| | | |
|---|---|---|
| KR | 10-08566 | 6/1980 |
| KR | 10-2008-0049244 | 6/2008 |
| WO | 01/70873 | 9/2001 |
| WO | 2006/112887 | 10/2006 |
| WO | 2008/091741 | 7/2008 |

OTHER PUBLICATIONS

Seo et al, J. Mater. Chem., 20, pp. 94-102, published online Oct. 7, 2009.*
Russell et al, Macromol. Symp., 159, pp. 77-88, 2000.*
Ting et al, J. Vac. Sci. Technol., B 26(5), pp. 1684-1689, 2008.*
Li et al, Polymer International, 55, pp. 25-30, 2006.*
P. Mansky et al., "Controlling Polymer-Surface Interactions with Random Copolymer Brushes," Science, vol. 275, Mar. 7, 1997, pp. 1458-1460.
Myungeun Seo, The Polymer Society of Korea, Apr. 9, 2009, p. 50.
Korean Office Action—Korean Application No. 10-2009-0039545 issued on Nov. 30, 2011, citing KR 10-2008-0049244.

* cited by examiner

*Primary Examiner* — Erma Cameron
(74) *Attorney, Agent, or Firm* — Cantor Colburn LLP (57) ABSTRACT

Provided is the preparation of a coil-comb block copolymer and a method for producing nanostructures formed by the copolymer. Particularly, provided is a method for producing nanostructured polymer thin films, including: preparing a coil-comb block copolymer via a controlled polymer polymerization process; forming a thin film of the block copolymer on a substrate and carrying out heat treatment to form nanostructures including vertically aligned cylindrical microstructures; and irradiating ultraviolet rays to the thin film and carrying out oxygen plasma treatment to form nanostructured polymer thin films including cylindrical pores.

5 Claims, 6 Drawing Sheets
(5 of 6 Drawing Sheet(s) Filed in Color)

METHODS FOR THE PREPARATION OF COIL-COMB BLOCK COPOLYMERS AND THEIR NANOSTRUCTURES

CROSS-REFERENCE(S) TO RELATED APPLICATIONS

The present invention claims priority of Korean Patent Application No. 10-2009-0039545, filed on May 7, 2009, which is incorporated herein by reference.

BACKGROUND OF THE INVENTION

1. Field of the Invention

The present invention relates to the preparation of a coil-comb block copolymer and a method for producing nanostructures formed by the copolymer; and, more particularly, to a method for producing nanostructured polymer thin films, including: preparing a coil-comb block copolymer via a controlled polymer polymerization process; forming a thin film of the block copolymer on substrates made of various materials and carrying out heat treatment to form nanostructures including vertically aligned cylindrical microstructures; and irradiating ultraviolet rays to the thin film and carrying out oxygen plasma treatment to form nanostructured polymer thin films including cylindrical pores.

2. Description of Related Art

Block copolymers refer to polymers having a structure including two or more types of polymer blocks linked to each other. When chemically different polymer blocks are linked to each other, a so-called microphase separation phenomenon occurs, wherein each block forms a different microstructure depending on the length of the polymer block. Since general polymer blocks have a length of several tens nanometers, such microphase separation in block copolymers may be utilized as a method for producing nanostructures having various structures.

Particularly, since block copolymers aligned with cylindrical microstructures easily removable along the vertical direction to the substrate in a thin film state can be converted with ease into a porous polymer thin film having a high aspect ratio, they have received great attention. Possible applications of such block copolymers may include block copolymer lithography, separators incorporated into nanofiltration systems, molds for fabricating inorganic nanostructures, or the like.

Polystyrene-block-poly(methyl methacrylate) forms a cylindrical microstructure of the poly(methyl methacrylate) blocks surrounded with the polystyrene blocks in a thin film state, when the volumetric proportion of the poly(methyl methacrylate) block is approximately 0.3. When the thin film is irradiated with ultraviolet rays, the polystyrene blocks are crosslinked, while the poly(methyl methacrylate) blocks are decomposed. The thin film may be converted with ease into a porous polymer thin film by removing all of the poly(methyl methacrylate) blocks via additional oxygen plasma treatment.

However, in general, the cylindrical microstructures formed by the poly(methyl methacrylate) blocks are aligned in parallel with the substrate, because the polymer blocks showing higher interaction with the substrate cover the surface selectively before the cylindrical microstructures are formed. In the case of the most widely used silicon wafers, polystyrene blocks cover the surface before the cylindrical microstructure of poly(methyl methacrylate) blocks are aligned in parallel with the substrate on the polystyrene block layer.

Therefore, many attempts have been made to align the cylindrical microstructures vertically to the substrate. Typical examples of such attempts for aligning the nanostructures of a block copolymer thin film that have been developed to date include the methods as described hereinafter.

The neutral brush method includes preparing a random copolymer of polystyrene-poly(methyl methacrylate) having a hydroxyl group at one end thereof with a ratio of 0.64-0.36, and linking the random copolymer to a hydroxyl group-containing substrate via covalent bonding. Then, polystyrene-block-poly(methyl methacrylate) is spin-coated onto the substrate treated as mentioned above, followed by heat treatment at a temperature of 150° C. or higher, so as to obtain a vertically aligned cylindrical microstructure stably. As another neutral brush, random copolymers having a hydroxyl group in a part of the backbone, or those crosslinkable under heating or UV irradiation have been developed and used (*Science* 1997, 275, 1458-1460). However, the neutral brush method has limitations in that it additionally requires precise polymer synthesis, and it uses substrate surface having hydroxyl groups. Moreover, since the neutral brush still remains after forming the porous polymer thin film, it is not possible to obtain a pure substrate surface.

In addition, the electric field method uses the fact that each microstructure of a block copolymer has a different dielectric constant, and includes aligning nanostructures depending on the direction of an electric field upon the application of the electric field (*Adv. Mater.* 2000, 12, 787-791, International Patent Publication No. WO2001070873). However, the electric field method is disadvantageous in that it requires electrodes capable of applying an electric field to both surface of the block copolymer, it uses a strong electric field, and it is not applicable to thin films having a thickness greater than a certain thickness.

In addition, the graphoepitaxy method includes forming a pattern having irregularities on the surface of a substrate using, for example, UV lithography, and further forming a thin film of block copolymer thereon, so that the alignment of the block copolymer is determined by the direction of the pattern, when the size of the pattern used as a substrate is an integer multiple of the size of the nanostructures of the block copolymer (*Science* 2008, 321, 939-943, International Patent Publication No. WO200891741). However, the graphoepitaxy method requires forming an additional pattern on the surface of the substrate. Therefore, it is not possible to obtain nanostructures of pure block copolymer.

Further, the epitaxial self-assembly method includes forming a chemical pattern of an organic single molecular layer on the surface of a substrate to the same size as the nanostructures of a block copolymer, and further forming a thin film of block copolymer thereon, so that the nanostructures of the block copolymer are aligned vertically while the nanostructures of the block copolymer are formed along the chemical pattern of the surface of the substrate (*Science* 2005, 308, 1442-1446, International Patent Publication No. WO2006112887). However, the epitaxial self-assembly method is disadvantageous in that it uses expensive systems, such as extreme ultraviolet (EUV) or e-beam lithography systems, for a long time to form the chemical pattern of the organic single molecular layer. Moreover, the substrates that may be used in this method are limited to those capable of forming organic single molecular layers thereon.

Finally, Korean Patent Registration No. 10-08566 discloses a method including forming an oxide thin film on the surface of a substrate, and forming a neutral brush thereon to increase the diversity of the substrate. However, the method still has problems in that it additionally requires vacuum deposition of an oxide thin film and uses a neutral brush.

As a result, there is an imminent need for developing a method for overcoming the problems of the known methods using block copolymer thin films to form vertically aligned nanostructures and for producing a block copolymer thin film including a vertically aligned cylindrical microstructure on various kinds of substrates with ease. To satisfy such a need, it is required to develop a method for aligning the cylindrical microstructures in the vertical direction without surface modification of a substrate or without application of an electric field, etc.

SUMMARY OF THE INVENTION

An embodiment of the present invention is directed to providing a method for producing a block copolymer thin film including vertically aligned cylindrical microstructures on various kinds of substrates with ease.

We have conducted many studies to achieve the object of the present invention and have found that it is possible to obtain a vertically aligned block copolymer thin film on various kinds of substrates with no particular limitation merely by simple heat treatment and to obtain a porous polymer thin film having vertically aligned cylindrical pores, when the structure of a block copolymer is modified into that of a coil-comb type block copolymer.

Particularly, the present invention provides a method for producing vertical cylindrical nanostructures, including:
preparing a coil-comb block copolymer;
forming a thin film of the block copolymer on a substrate and carrying out heat treatment to form nanostructures including vertically aligned cylindrical microstructures; and
irradiating ultraviolet rays to the thin film and carrying out oxygen plasma treatment to form nanostructured polymer thin films including cylindrical pores.

When the coil-comb block copolymer provided by the present invention is designed to allow phase separation between the coil and the comb teeth, the comb teeth, which have a tendency to spread widely to avoid repulsion force between one comb tooth and the adjacent comb tooth, spread around the coil block while leaving the coil block at the center. In this manner, the coil-comb block copolymer naturally forms a phase separated structure having a positive curvature. Therefore, the coil-comb copolymer provided by the present invention always forms the above-described structure regardless of the material forming the substrate, and thus it has cylindrical microstructures in which the coil blocks are aligned vertically.

The coil-comb copolymer may be obtained by polymerizing coil blocks first, polymerizing blocks corresponding to the framework of the comb, and then polymerizing the comb tooth blocks at the side chain of the framework blocks. Herein, it is required for each block to be provided as a polymer having a suitable length and low polydispersity using a controlled polymerization process. Each block of the block copolymer is preferably prepared through the reversible addition-fragmentation chain transfer (RAFT) or atom transfer radical polymerization (ATRP) process.

The RAFT process includes carrying out polymerization by introducing a radical polymerization initiator and a chain transfer agent together with monomers, so that the growth and polydispersity of the resultant polymer are controlled through the reversible chain transfer reaction occurring at the end of the growing polymer chain. The ATRP process includes carrying out polymerization by introducing a halogen group-terminated initiator and a transition metal complex capable of being oxidized through the reaction with the halogen group (for example, copper (I) ions and ligand substances) together with monomers, so that the polymerization is allowed only when the halogen group reacts with the copper (I) complex to form a copper (II) complex and radicals are formed at the initiator moiety, and thus the growth and polydispersity of the resultant polymer are controlled.

The block copolymer that may be used in the present invention may be selected from the group consisting of poly(methyl methacrylate)-block-poly(2-(2-bromopropionyloxy)-ethylacrylate)-graft-polystyrene(PMMA-b-PBPEA-g-PS), polystyrene-block-poly(2-(2-bromopropionyloxy)-ethyl acrylate)-graft-poly(methyl methacrylate) (PS-b-PBPEA-g-PMMA), and poly(ethylene oxide)-block-poly(2-(2-bromopropionyloxy)-ethyl acrylate)-graft-polystyrene (PEO-b-PBPEA-g-PS). PMMA-b-PBPEA-g-PS is preferred because it is prepared with ease, and is converted with ease into a porous polymer thin film through UV irradiation and oxygen plasma treatment.

In the case of PMMA-b-PBPEA-g-PS, a preferred proportion of polystyrene is between 0.5 and 0.8 in order to obtain cylindrical microstructures of poly(methyl methacrylate).

In the case of PMMA-b-PBPEA-g-PS, the cylindrical microstructures formed by poly(methyl methacrylate) blocks have a size controllable by the degree of polymerization, for example a size of between 1 and 100 nanometers.

The chain transfer agent that may be used in the RAFT process in accordance with the present invention includes a dithioester compound represented by the following chemical formula:

wherein
examples of Z include phenyl, methylthioxy, pyrrole, etc.; and examples of R include 2-cyanopropan-2-yl, 2-phenylpropan-2-yl, methoxycarbonylphenylmethyl, etc.

The resultant coil-comb block copolymer may be spin-coated onto a substrate from a solution with an adequate concentration, thereby providing a thin film.

The substrate that may be used herein is selected from the group consisting of metals, metalloids, polymers, etc. Particular examples of the substrate may include gold, copper, silicone, hexamethyldisilazane-treated silicone, piranha solution-treated silicone, SU-8 resin, or the like.

The resultant polymer thin film may be heated at 150-200° C. under vacuum to obtain nanostructures including cylindrical microstructures aligned vertically to the substrate.

Then, the thin film may be irradiated with ultraviolet rays to cause crosslinking of polystyrene simultaneously with decomposition of poly(methyl methacrylate). The poly(methyl methacrylate) decomposed in the above manner may be easily removed via etching with oxygen plasma and transformed into pores. In this manner, it is possible to obtain a porous polymer thin film including polystyrene.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF SPECIFIC EMBODIMENTS

The advantages, features and aspects of the invention will become apparent from the following description of the embodiments with reference to the accompanying drawings, which is set forth hereinafter. The present invention may, however, be embodied in many different forms and should not be construed as limited to the exemplary embodiments set forth therein.

The polymers obtained from the following examples are determined by nuclear magnetic resonance (NMR) spectrometry and gel permeation chromatography (GPC) analysis. NMR spectrometry is carried out with a Fourier Transform AVANCE 400 spectrometer. GPC analysis is carried out with a Viscotek T60A system using tetrahydrofuran as a solvent, wherein a refractive index (RI) detector is used to determine the molecular weight.

The microstructure formed by a block copolymer is determined by atomic force microscopy. Atomic force microscopy is carried out with a Nanoscope IIIa multi-mode atomic force microscope (Veeco, USA) in a tapping mode.

S-methoxycarbonylphenylmethyl dithiobenzoate (MCPDB) and 2-(2-bromopropionyloxy)-ethyl acrylate (BPEA) each are prepared according to [*Macromolecules* 2004, 37, 2709-2717] and *Macromolecules* 1998, 31, 9413-9415], respectively.

UV irradiation is performed with an Oriel Corporation Model 82531 system equipped with a high-pressure mercury-xenon lamp.

Preparation Example 1

Preparation of PMMA-b-PBPEA-g-PS by Concurrent Use of Controlled Polymerization Processes

PMMA

PMMA-b-PBPEA

-continued

PMMA-b-PBPEA-g-PS

[Preparation of Poly(methyl methacrylate) (PMMA) by Reversible Addition-Fragmentation Chain Transfer Process]

To a mixture of 10.08 g (0.101 mol) of methyl methacrylate, 7.0 mg (42 mmol) of 2,2'-azobisisobutyronitrile (AIBN), as a polymerization initiator, recrystallized in methanol and provided in the form of 0.2 wt % benzene solution, and 8.4 mg of MCPDB, as a chain transfer agent, provided in the form of 1 wt % benzene solution, benzene is added to a total volume of 5 mL. The mixture is transferred to a Schlenk flask and subjected to three cycles of freeze-pump-thaw repeatedly. The flask is heated to 80° C. under agitation for 22 hours to provide a polymer. After the polymerized mixture is cooled to room temperature, it is diluted with toluene and precipitated in n-hexane. The resultant precipitate is filtered to obtain a solid, which, in turn, is dissolved into tetrahydrofuran and reprecipitated in diethyl ether, followed by filtering, to obtain a solid. The solid is dried under vacuum to obtain 4.98 g of a desired product, PMMA (yield 49%).

Figure 1:
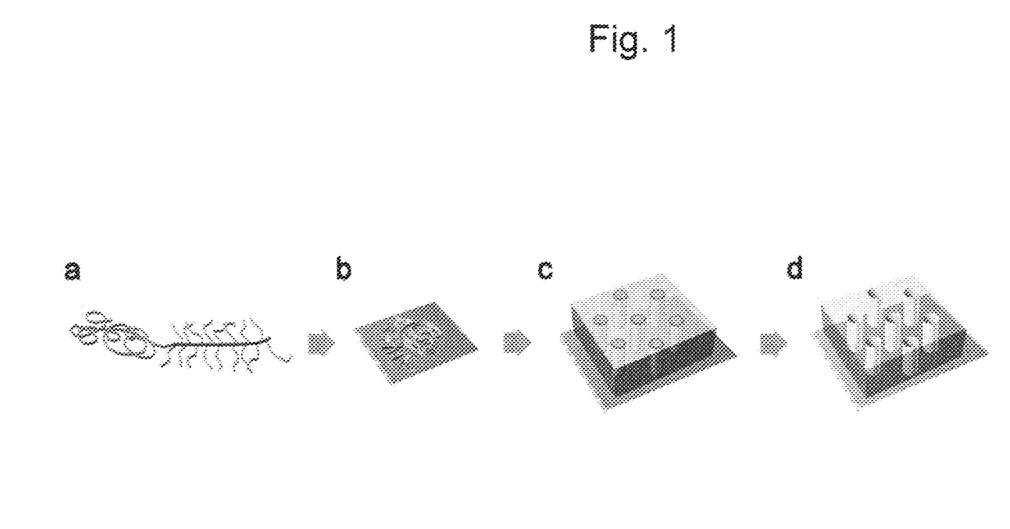
FIG. 1 is a schematic view illustrating a mechanism by which the coil-comb block copolymer provided by an embodiment of the present invention forms vertically aligned cylindrical nanostructures on the surface of a substrate.
Figure 2:
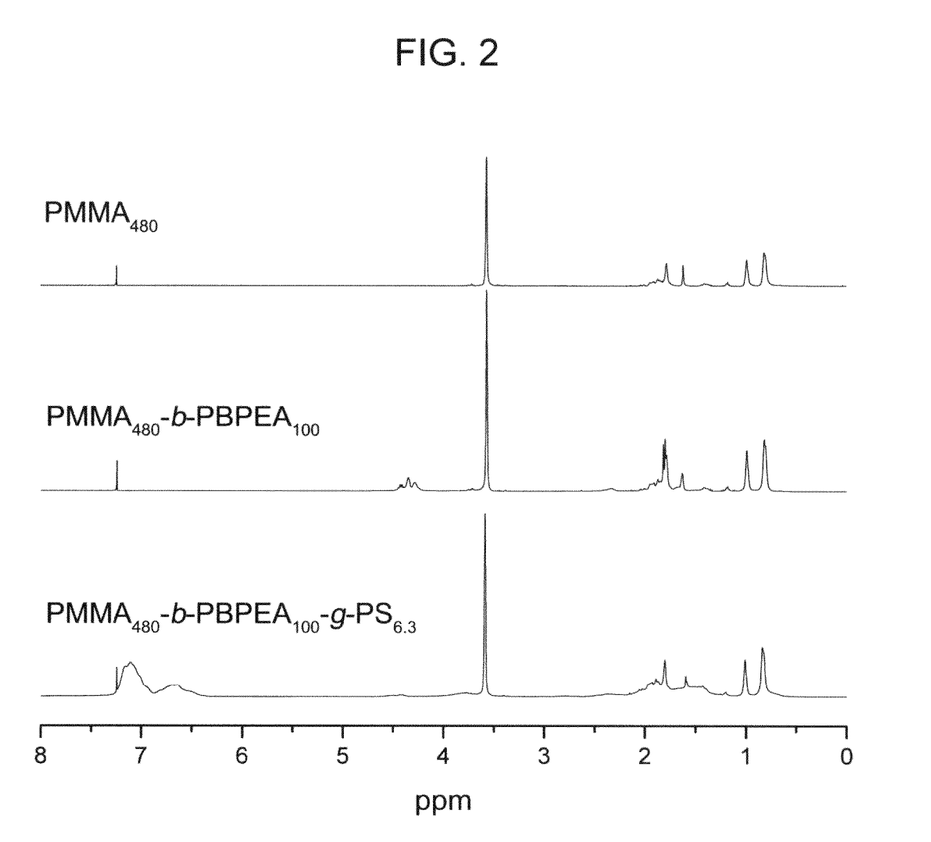
FIG. 2 shows $^1$H nuclear magnetic resonance (NMR) spectra of PMMA, PMMA-b-PBPEA, PMMA-b-PBPEA-g-PS obtained from Preparation Example 1 in accordance with an embodiment of the present invention.

$^1$H NMR (400 MHz, CDCl$_3$, ppm): 3.60, 1.90-1.78, 1.62, 1.39, 1.18, 0.99, 0.82. (FIG. 2)

Figure 3:
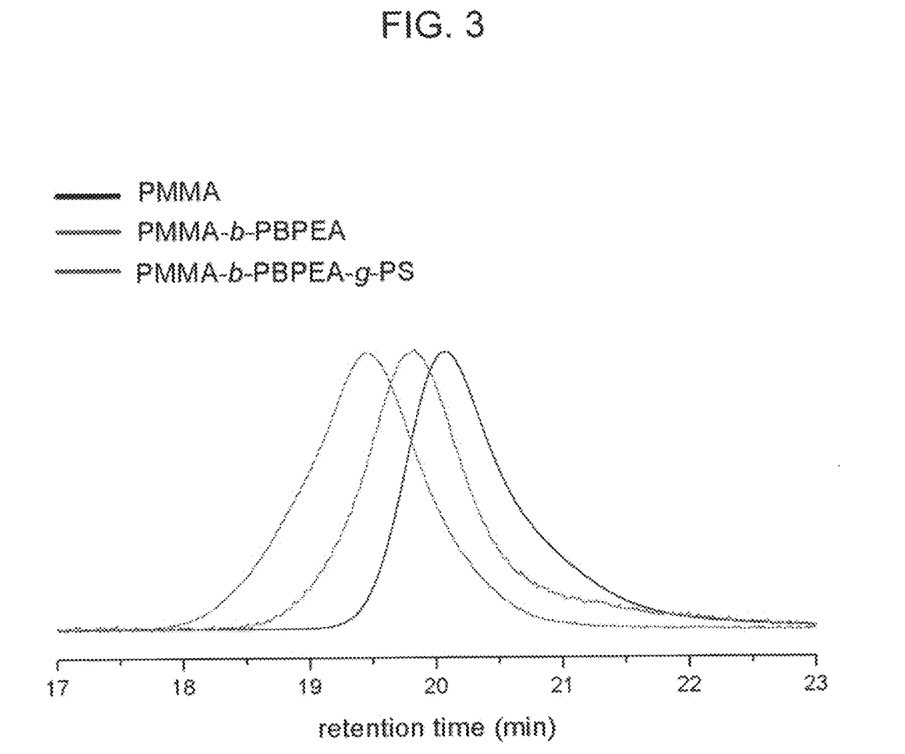
FIG. 3 shows the results of gel permeation chromatography (GPC) of the polymers obtained from Preparation Example 1 in accordance with an embodiment of the present invention.

$M_n$ 4.60×$\times 10^4$. Polydispersity index (PDI): 1.28. (FIG. 3).

Preparation of Poly(methyl methacrylate)-block-poly (2-(2-bromopropionyloxy)-ethyl acrylate (PMMA-b-PBPEA) by Reversible Addition-Fragmentation Chain Transfer Process To a mixture of 3 g of PMMA, as a chain transfer agent, obtained from the previous operation, 2.68 g (10.7 mmol) of BPEA and 1.1 g of AIBN provided in the form of 0.2 wt % benzene solution, benzene is added to a total volume of 12.5 mL. The mixture is transferred to a Schlenk flask and subjected to three cycles of freeze-pump-thaw repeatedly. The flask is heated to 70° C. under agitation for 13 hours to provide a polymer. After the polymerized mixture is cooled to room temperature, it is diluted with toluene and precipitated in diethyl ether. The resultant precipitate is filtered to obtain a solid, which, in turn, is dissolved into tetrahydrofuran and reprecipitated in diethyl ether, followed by filtering, to obtain a solid. The solid is dried under vacuum to obtain 3.98 g of a desired product, PMMA-b-PBPEA (yield 37%).

$^1$H NMR (400 MHz, CDCl$_3$, ppm): 4.43-4.28, 3.57, 2.34, 1.90-1.78, 1.62, 1.41, 1.18, 0.99, 0.82. (FIG. 2).

$M_n$ 5.26×$\times 10^4$. Polydispersity index (PDI): 1.43. (FIG. 3).

Preparation of Poly(methyl methacrylate)-block-poly (2-(2-bromopropionyloxy)-ethyl acrylate)-graft-polystyrene (PMMA-b-PBPEA-g-PS) by Atom Transfer Radical Polymerization As a typical example, the following description is made with reference to a polymerization degree of polystyrene of 17.7. First, 28.7 mg (0.2 mmol) of copper bromide and 34.7 mg (0.2 mmol) of N,N,N',N'',N'''-pentamethyldiethylene triamine are introduced into a Schlenk flask. Next, 1.5 mL of anisole is introduced into the flask using a gastight syringe. After the mixture is stabilized for 5 minutes, 2.29 mL (20 mmol) of styrene is introduced into the flask, and the resultant mixture is subjected to three cycles of freeze-pump-thaw repeatedly. Then, 0.2 g of PMMA-b-PBPEA obtained from the preceding operation is introduced into the flask after being dissolved into 1.94 mL of anisole. The flask is agitated for 130 minutes while being heated to 110° C. to obtain a polymer. After 130 minutes, the reaction is quenched by opening the flask to be exposed to the air, and then the reaction mixture is diluted with tetrahydrofuran and passed through a neutral alumina column to remove copper. The resultant solution is precipitated in n-hexane to obtain a solid, followed by filtering. Then, the solid is reprecipitated in n-hexane and dried under vacuum to obtain 0.58 g of PMMA-b-PBPEA-g-PS (yield 26%).

$^1$H NMR (400 MHz, CDCl$_3$, ppm): 7.29-6.27, 4.56-4.32, 4.12-3.30, 2.92-2.60, 2.60-1.11, 1.01, 0.87-0.63. (FIG. 2).

$M_n$ 1.50×$\times 10^5$. Polydispersity index (PDI): 1.36. (FIG. 3).

Example 1

Figure 4:
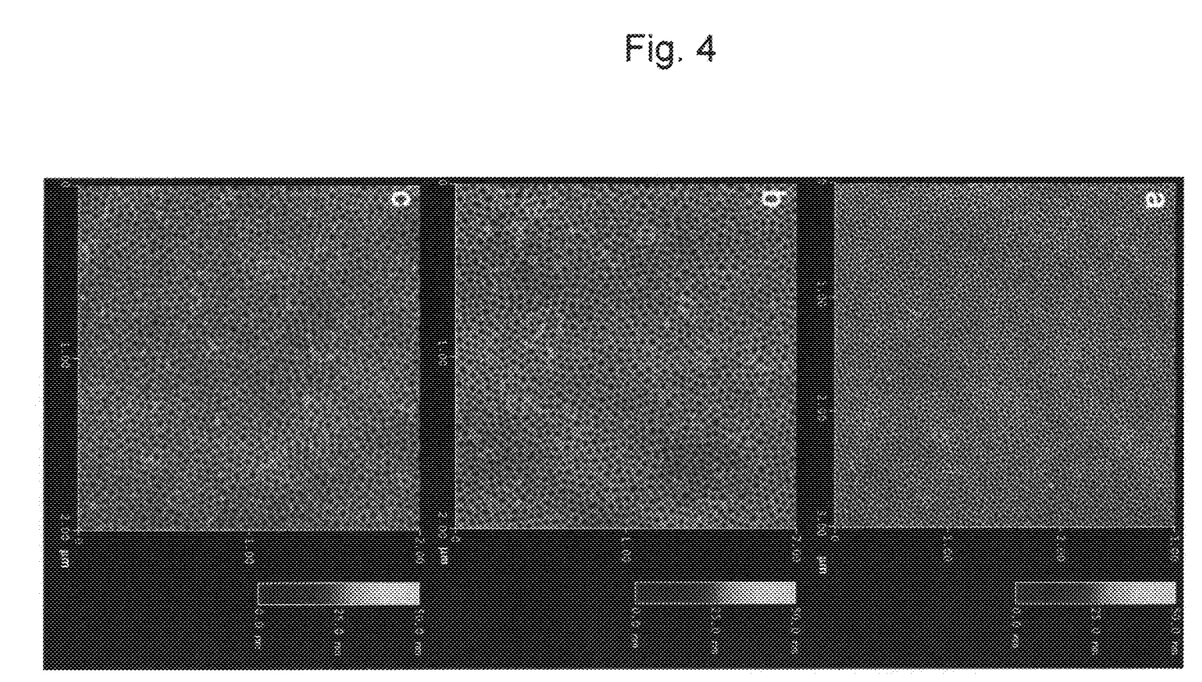
FIG. 4 shows the atomic force microscopy photographs of the porous polymer thin films obtained by UV and oxygen plasma treatment of the block copolymer thin films formed on a general silicon wafer (a), piranha-treated silicon wafer (b) and hexamethyldisilazane-treated silicon wafer (c) in accordance with Example 1.

Formation of Block Copolymer Thin Films and Porous Polymer Thin Films on Silicon Wafers Treated in Different Manners a. Cylindrical Porous Thin Film Formed on General Silicon Wafer First, 1.5 wt % solution of PMMA-b-PBPEA-g-PS in toluene is spin coated on a cleaned silicon wafer, followed by heat treatment at 200° C. for 24 hours under vacuum, to obtain a polymer thin film with a thickness of 40 nm. A Spectrolinker XL-1500 UV Crosslinker system (Krackeler Scientific Inc.) equipped with six 15 Watt UV-C (254 nm) tubes is used to irradiate ultraviolet rays to the thin film at a dose of 2 J/cm$^2$. Next, a reactive ion etcher, SHE-4D-20 (Saehan), is used to treat the thin film with oxygen plasma under the conditions of 50 Watt and 40 cm$^3$/min for 20 seconds to obtain a porous polymer thin film having cylindrical pores formed to the bottom of the substrate. As can be seen from (a) in FIG. 4, a porous polymer thin film having vertically aligned cylindrical pores is formed sufficiently.

b. Cylindrical Porous Thin Film Formed on Piranha Solution-Treated Silicon Wafer Concentrated sulfuric acid is mixed with 30% aqueous hydrogen peroxide solution in a ratio of 0.7:0.3 to form a piranha solution. A silicon wafer is dipped into the solution and heated at 90-100° C. for 1 hour. The silicon wafer is taken from the solution, washed with distilled water and dried under nitrogen atmosphere. Then, 1.5 wt % solution of PMMA-b-PBPEA-g-PS in toluene is spin coated on the silicon wafer treated as described above, followed by heat treatment at 200° C. for 24 hours under vacuum, to obtain a polymer thin film with a thickness of 40 nm. The polymer thin film is treated in the same manner as described in Example 1a. As can be seen from (b) in FIG. 4, a porous polymer thin film having vertically aligned cylindrical pores is formed sufficiently.

c. Block Copolymer Thin Film Formed on Hexamethyl Disilazane-Treated Silicon Wafer A silicon wafer is exposed to vapor of hexamethyl disilazane for 24 hours to form a trimethylsilyl film on the wafer surface. Then, 1.5 wt % solution of PMMA-b-PBPEA-g-PS in toluene is spin coated on the silicon wafer, followed by heat treatment at 200° C. for 24 hours under vacuum, to obtain a polymer thin film with a thickness of 40 nm. The polymer thin film is treated in the same manner as described in Example 1a. As can be seen from (c) in FIG. 4, a porous polymer thin film having vertically aligned cylindrical pores is formed sufficiently.

Example 2

Formation of Block Copolymer Thin Film and Porous Polymer Thin Film on Metal Substrate

[Block Copolymer Thin Film Formed on Gold Foil]

Figure 5:
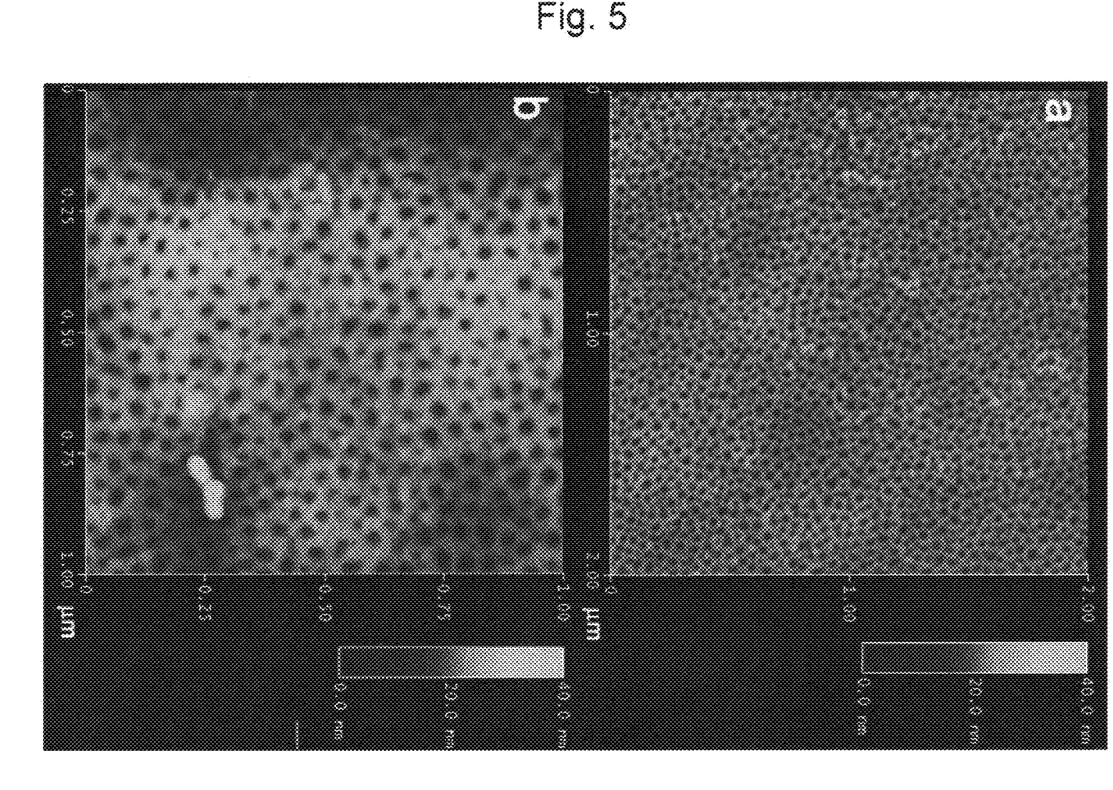
FIG. 5 shows the atomic force microscopy photographs of the porous polymer thin films obtained by UV and oxygen plasma treatment of the block copolymer thin films formed on gold foil and copper foil in accordance with Example 2.

Gold foil, formed by pyrolysis on a chrome layer vacuum deposited on the surface of silicon 100, is purchased. Then, 1.5 wt % solution of PMMA-b-PBPEA-g-PS in toluene is spin coated on the surface of gold foil, followed by heat treatment at 200° C. for 24 hours under vacuum, to obtain a polymer thin film with a thickness of 40 nm. The thin film is irradiated with ultraviolet rays and treated with oxygen plasma under the same conditions as Example 1a to obtain a porous polymer thin film having cylindrical pores formed to the bottom of the substrate. As can be seen from (a) in FIG. 5, a porous polymer thin film having vertically aligned cylindrical pores is formed sufficiently on the metal substrate.

[Block Copolymer Thin Film Formed on Copper Foil]

After commercially available copper foil is fixed onto a silicon wafer, 1.5 wt % solution of PMMA-b-PBPEA-g-PS in toluene is spin coated on the surface of copper foil, followed by heat treatment at 200° C. for 24 hours under vacuum, to obtain a polymer thin film with a thickness of 40 nm. The thin film is irradiated with ultraviolet rays and treated with oxygen plasma under the same conditions as Example 1a to obtain a porous polymer thin film having cylindrical pores formed to the bottom of the substrate. As can be seen from (b) in FIG. 5, a porous polymer thin film having vertically aligned cylindrical pores is formed sufficiently on the metal substrate.

Example 3

Formation of Block Copolymer Thin Film on Photoresist Pattern and Porous Polymer Thin Film Formed Therefrom

[Block Copolymer Thin Film Formed on Photoresist Resin]

Figure 6:
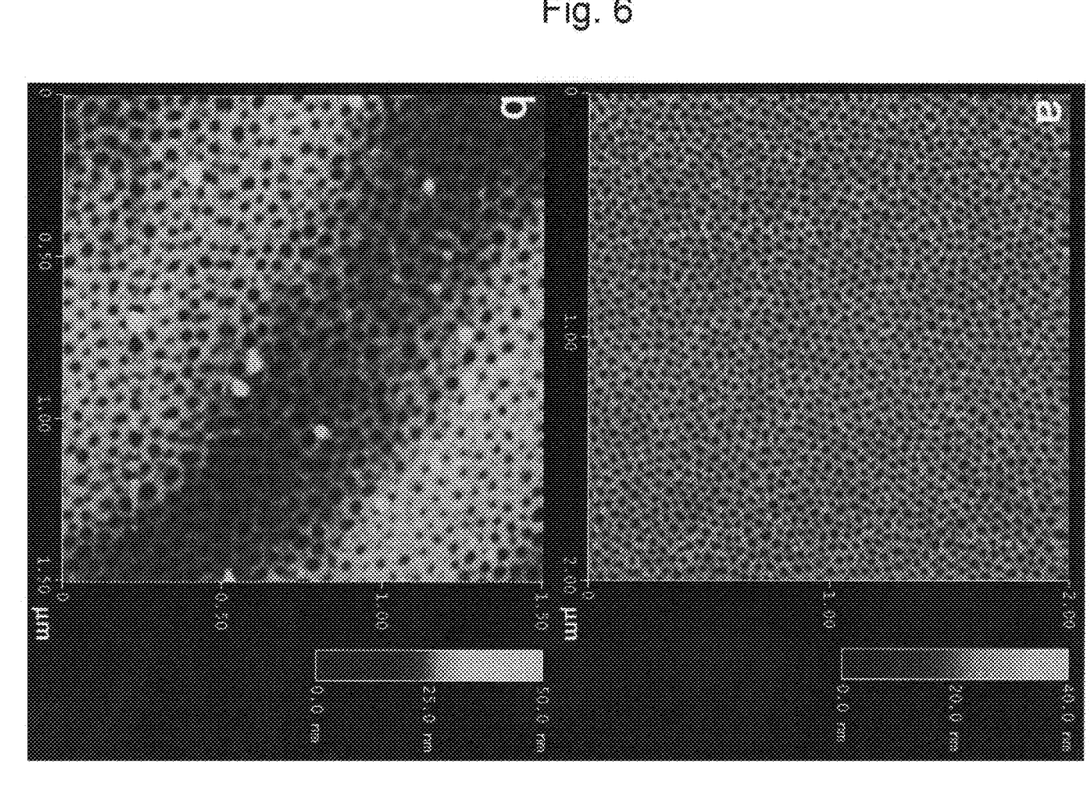
FIG. 6 shows the atomic force microscopy photographs of the porous polymer thin films obtained by UV and oxygen plasma treatment of the block copolymer thin films formed on a photoresist resin and pattern in accordance with Example 3.

First, SU-8 #25 cyclopentanone solution (2.5 wt %) available from MicroChem Corp. is filtered through a 2.0 mm filter, and spin coated on a silicon wafer, followed by heating at 95° C. for 2 minutes. Next, the resultant thin film with a thickness of 50 nm is irradiated with ultraviolet rays for 100 seconds and heated at 95° C. for 5 minutes. Then, 1.5 wt % solution of PMMA-b-PBPEA-g-PS in toluene is spin coated on the surface of the resultant substrate, followed by heat treatment at 200° C. for 24 hours under vacuum, to obtain a polymer thin film with a thickness of 40 nm. The thin film is irradiated with ultraviolet rays and treated with oxygen plasma under the same conditions as Example 1a to obtain a porous polymer thin film having cylindrical pores formed to the bottom of the substrate. As can be seen from (a) in FIG. 6, a porous polymer thin film having vertically aligned cylindrical pores is formed sufficiently on the photoresist resin.

[Block Copolymer Thin Film Formed on Photoresist Pattern]

First, SU-8 #25 cyclopentanone solution (2.5 wt %) is filtered through a 2.0 mm filter, and spin coated on a silicon wafer, followed by heating at 95° C. for 2 minutes. Next, the resultant thin film with a thickness of 50 nm is irradiated with ultraviolet rays for 30 seconds using a mask having a linear pattern and heated at 95° C. for 2 minutes. The resultant thin film is dipped into propylene glycol monomethyl ether acetate for 1 minute and washed with isopropyl alcohol to remove non-polymerized photoresist. Then, 1.5 wt % solution of PMMA-b-PBPEA-g-PS in toluene is spin coated on the surface of the resultant substrate, followed by heat treatment at 200° C. for 24 hours under vacuum, to obtain a polymer thin film with a thickness of 40 nm. The thin film is irradiated with ultraviolet rays and treated with oxygen plasma under the same conditions as Example 1a to obtain a porous polymer thin film having cylindrical pores formed to the bottom of the substrate. As can be seen from (b) in FIG. 6, a porous polymer thin film having vertically aligned cylindrical pores is formed sufficiently on the photoresist pattern.

As can be seen from the foregoing, a thermally stable block copolymer thin film is obtained merely by simple heat treatment in accordance with an embodiment of the present invention, while avoiding additional processes (e.g. modification of a substrate using another polymer, or application of an electric/magnetic field to a block copolymer thin film) required for producing a block copolymer thin film including vertically aligned cylindrical microstructures according to the related art. Additionally, the block copolymer thin film may be applied to various substrates with no particular limitation in the materials. Further, since the block copolymer thin film is converted easily into a porous polymer thin film including vertically aligned cylindrical pores, it shows high industrial applicability as a nanostructure mold that may be used on various substrates.

While the present invention has been described with respect to the specific embodiments, it will be apparent to those skilled in the art that various changes and modifications may be made without departing from the spirit and scope of the invention as defined in the following claims.

What is claimed is:

1. A method for producing cylindrical nanostructures vertically aligned on substrates, comprising:
    preparing, by concurrent use of RAFT and ATRP, more than one block copolymer selected from poly(methyl methacrylate)-block-poly(2-(2-bromopropionyloxy)-ethyl acrylate)-graft-polystyrene, polystyrene-block-poly(2-(2-bromopropionyloxy)-ethyl acrylate)-graft-poly(methyl methacrylate), and poly(ethylene oxide)-block-poly(2-(2-bromopropionyloxy)-ethyl acrylate)-graft-polystyrene;
    forming a thin film of the block copolymer on a substrate by coating and carrying out heat treatment to form nanostructures including vertically aligned cylindrical microstructures; and
    irradiating ultraviolet rays to the thin film including cylindrical nanostructures vertically aligned on the substrates and carrying out oxygen plasma treatment to form nanostructured polymer thin films including cylindrical pores.

2. The method for producing cylindrical nanostructures vertically aligned on the substrates according to claim 1, wherein the polystyrene polymer has a volumetric proportion of 0.5-0.8 in the block copolymer.

3. The method for producing cylindrical nanostructures vertically aligned on the substrates according to claim 1, wherein the substrate used in forming a thin film of the block copolymer is at least one selected from the group consisting of metals, metalloids and polymers.

4. The method for producing cylindrical nanostructures vertically aligned on the substrates according to claim 1, wherein the thin film of the block copolymer is formed by spin coating a copolymer solution onto the substrate.

5. The method for producing cylindrical nanostructures vertically aligned on the substrates according to claim 1, wherein the heat treatment is carried out at 150-200°C. under vacuum.

* * * * *